(12) United States Patent
Hill et al.

(10) Patent No.: US 7,723,224 B2
(45) Date of Patent: May 25, 2010

(54) MICROELECTRONIC ASSEMBLY WITH BACK SIDE METALLIZATION AND METHOD FOR FORMING THE SAME

(75) Inventors: Darrell G. Hill, Tempe, AZ (US); Philip H. Bowles, Fountain Hills, AZ (US); Jan Campbell, McCaskill, AK (US); Terry K. Daly, Gilbert, AZ (US); Jason R. Fender, Chandler, AZ (US); Lakshmi N. Ramanathan, Chandler, AZ (US); Neil T. Tracht, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 780 days.

(21) Appl. No.: 11/453,763

(22) Filed: Jun. 14, 2006

(65) Prior Publication Data

US 2007/0293033 A1 Dec. 20, 2007

(51) Int. Cl.
*H01L 21/44* (2006.01)

(52) U.S. Cl. ............... 438/612; 438/613; 257/E21.508

(58) Field of Classification Search ........................ None
See application file for complete search history.

(56) References Cited

U.S. PATENT DOCUMENTS

| | | | |
|---|---|---|---|
| 4,926,022 A | 5/1990 | Freedman | |
| 5,227,604 A | 7/1993 | Freedman | |
| 5,378,926 A | 1/1995 | Chi | |
| 5,426,072 A * | 6/1995 | Finnila | 438/107 |
| 5,495,089 A | 2/1996 | Freedman et al. | |
| 5,563,102 A * | 10/1996 | Michael | 438/614 |
| 5,730,932 A | 3/1998 | Sarkhel et al. | |
| 5,763,854 A | 6/1998 | Dittman et al. | |
| 5,841,197 A * | 11/1998 | Adamic, Jr. | 257/777 |
| 5,949,140 A | 9/1999 | Nishi | |
| 5,972,736 A | 10/1999 | Malladi et al. | |
| 6,180,265 B1 * | 1/2001 | Erickson | 428/652 |
| 6,274,823 B1 | 8/2001 | Khandros et al. | |
| 6,329,608 B1 * | 12/2001 | Rinne et al. | 174/261 |
| 6,451,681 B1 * | 9/2002 | Greer | 438/601 |
| 6,656,828 B1 * | 12/2003 | Maitani et al. | 438/613 |
| 6,894,358 B2 | 5/2005 | Leib et al. | |
| 6,911,392 B2 | 6/2005 | Bieck et al. | |
| 7,354,798 B2 | 4/2008 | Pogge et al. | |
| 7,361,993 B2 * | 4/2008 | Coolbaugh et al. | 257/758 |
| 2001/0005043 A1 | 6/2001 | Nakanishi et al. | |
| 2001/0015652 A1 | 8/2001 | Eldridge et al. | |

(Continued)

OTHER PUBLICATIONS

International Search Report PCT/US 07/65922 dated Nov. 9, 2007.

*Primary Examiner*—W. David Coleman
*Assistant Examiner*—Shaka Scarlett
(74) *Attorney, Agent, or Firm*—Ingrassia, Fisher & Lorenz, P.C.

(57) ABSTRACT

A method is provided for forming a microelectronic assembly. A contact structure (46) is formed over a first side of a first substrate (20) having a microelectronic device formed over a second side thereof. The contact structure is electrically connected to the microelectronic device. A non-solderable layer (52) is formed over at least a portion of the contact structure and at least a portion of the first substrate. The contact structure and a second substrate (62) are interconnected with solder (68).

12 Claims, 17 Drawing Sheets

U.S. PATENT DOCUMENTS

| | | |
|---|---|---|
| 2002/0127839 A1 | 9/2002 | Umetsu et al. |
| 2005/0006740 A1 | 1/2005 | Letertre et al. |
| 2005/0104215 A1 | 5/2005 | Kao et al. |
| 2005/0156297 A1 | 7/2005 | Farnworth et al. |
| 2005/0214977 A1 | 9/2005 | Rumer et al. |
| 2006/0043569 A1* | 3/2006 | Benson et al. ............... 257/698 |
| 2007/0045388 A1 | 3/2007 | Farnworth et al. |

* cited by examiner

MICROELECTRONIC ASSEMBLY WITH BACK SIDE METALLIZATION AND METHOD FOR FORMING THE SAME

FIELD OF THE INVENTION

The present invention generally relates to a microelectronic assembly and a method for fabricating a microelectronic assembly, and more particularly relates to a method for forming back side metallization on a semiconductor device.

BACKGROUND OF THE INVENTION

Integrated circuit devices are formed on semiconductor substrates, or wafers. The wafers are then sawed into microelectronic dies, or semiconductor chips, with each die carrying a respective integrated circuit. Each semiconductor chip is mounted to a package, or carrier, substrate, which is then mounted to a circuit board, or motherboard, before being installed in an electronic system.

The two most common types of electrical connections made from the die to the package substrate are known as wirebonding and "flip-chip" connections. Wirebonding generally involves running a wire from an appropriate contact point on the die to such a point on the package substrate. Flip-chip connections, which for many applications are considered to be superior, involve forming conductors from the integrated circuits on the front side of the die using solder to make connections to the package substrate.

One of the problems associated with the manufacturing of flip-chip connections is that, because solder is used to electrically and mechanically connect the die to the package substrate, the metals used on both the package substrate and the die must be compatible with the particular solder processing that is used. This problem is particularly prevalent when gallium arsenide substrates are being used, as gold is the most common metal that is used to form the conductors on the die. Because gold readily reacts with the tin present in most solders, especially the tin-rich, lead-free solders, the conductors are often destroyed during the multiple heating processes that are required to complete the manufacturing of the packaged devices. This is especially frequent when the gold conductors contact the heated solder.

Accordingly, it is desirable to provide a method for forming a microelectronic assembly having interfaces that allow solder to be used to form connections to package substrates and the like. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawings, wherein like numerals denote like elements.

DETAILED DESCRIPTION OF THE INVENTION

The following detailed description is merely exemplary in nature and is not intended to limit the invention or application and uses of the invention. Furthermore, there is no intention to be bound by any expressed or implied theory presented in the preceding technical field, background, brief summary, or the following detailed description. It should also be noted that FIGS. 1-17 are merely illustrative and may not be drawn to scale.

Figure 1:
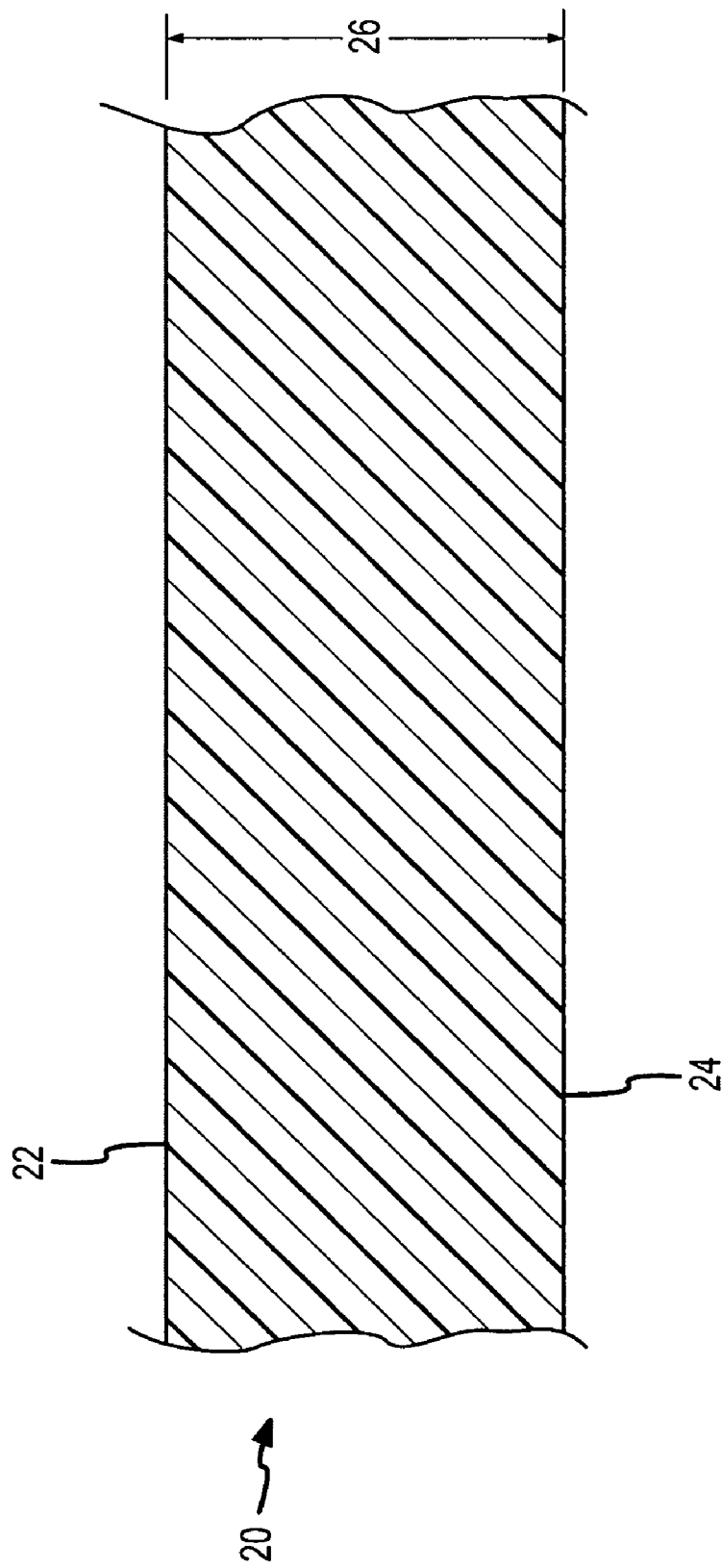
FIG. 1 is a cross-sectional side view of a semiconductor substrate.

FIGS. 1-17 illustrate a method for forming a microelectronic assembly, according to one embodiment of the invention. Referring to FIG. 1, there is illustrated a semiconductor substrate 20. The semiconductor substrate 20 is made of a semiconductor material, such as gallium arsenide (GaAs), gallium nitride (GaN), or silicon (Si). The substrate 20 has a front side 22, or upper surface, a back side 24, or lower surface, and an initial thickness 26 of, for example, between 600 and 1000 microns. Although only a portion of the semiconductor substrate 20 is illustrated, it should be understood that the substrate 20 may be a semiconductor wafer with a diameter of, for example, 150, 200, or 300 millimeters. Additionally, although not specifically illustrated, the substrate 20 may include a plurality of microelectronic devices, such as integrated circuits having at least one, or a plurality of, transistors, capacitors, etc., formed on the front side 22 thereof. The integrated circuits may be divided amongst multiple dies, or "die," on the substrate 20, as is commonly understood in the art. Furthermore, although the following process steps may be shown as being performed on only a small portion of the substrate 20, it should be understood that each of the steps may be performed on substantially the entire substrate 20, or multiple dice, simultaneously.

Figure 2:
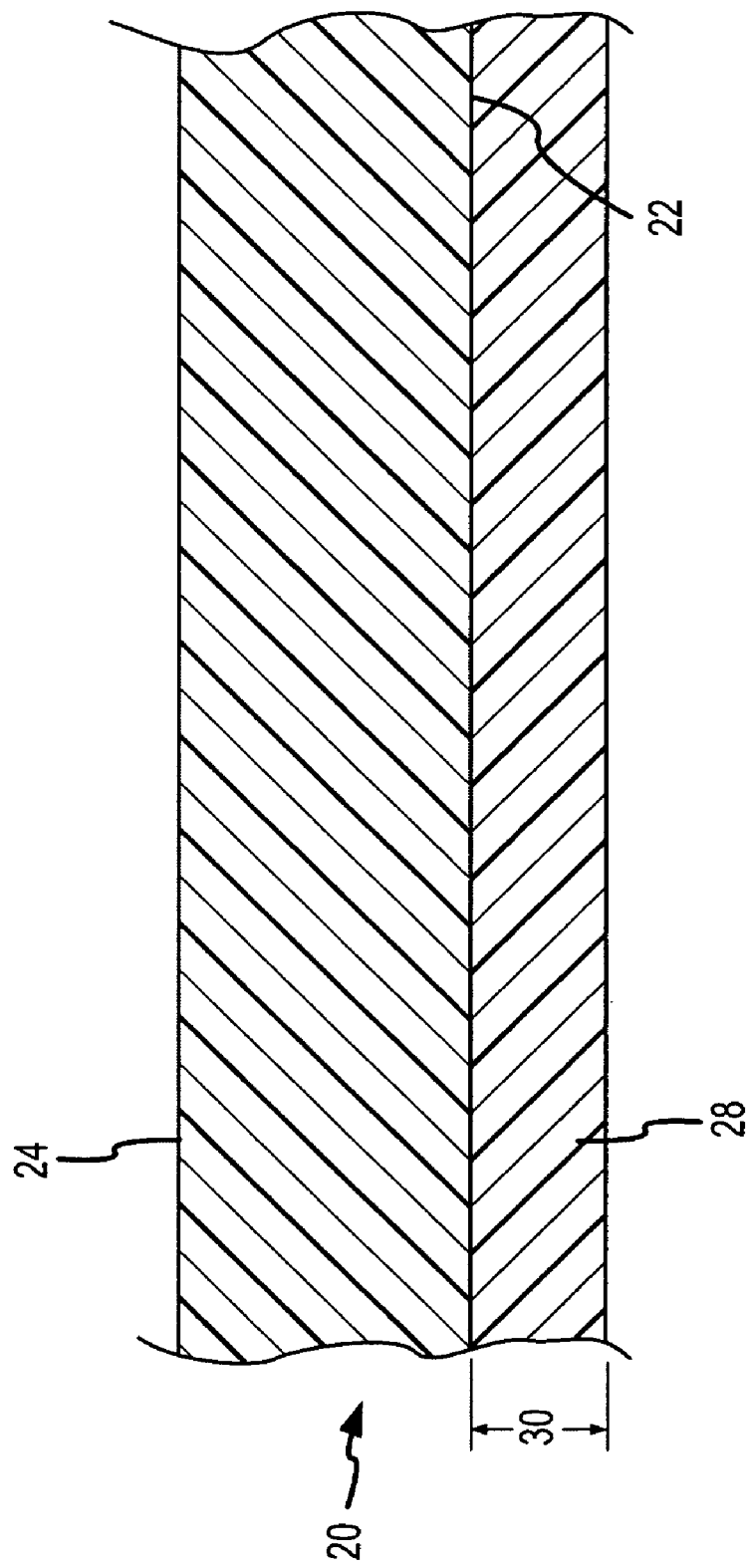
FIG. 2 is a cross-sectional side view of the semiconductor substrate of FIG. 1 mounted to a support substrate.

The semiconductor substrate 20 is first mounted to a support substrate 28, or stiffener, as shown in FIG. 2 with the semiconductor substrate 20 upside down relative to FIG. 1. The support substrate 28 is thus connected to the front side 22 of the semiconductor substrate 20 and has a thickness 30 of, for example, between 250 and 500 microns. The support substrate 28 is made of a material, such as, for example, sapphire or quartz, which is chemically inert with the materials used in subsequent processing steps. Although not specifically illustrated, the semiconductor substrate 20 is mounted to the support substrate 28 using a low temperature, organic adhesive which may have a softening temperature below 160° C. In one embodiment, the adhesive has a softening temperature of approximately 150° C.

Figure 3:
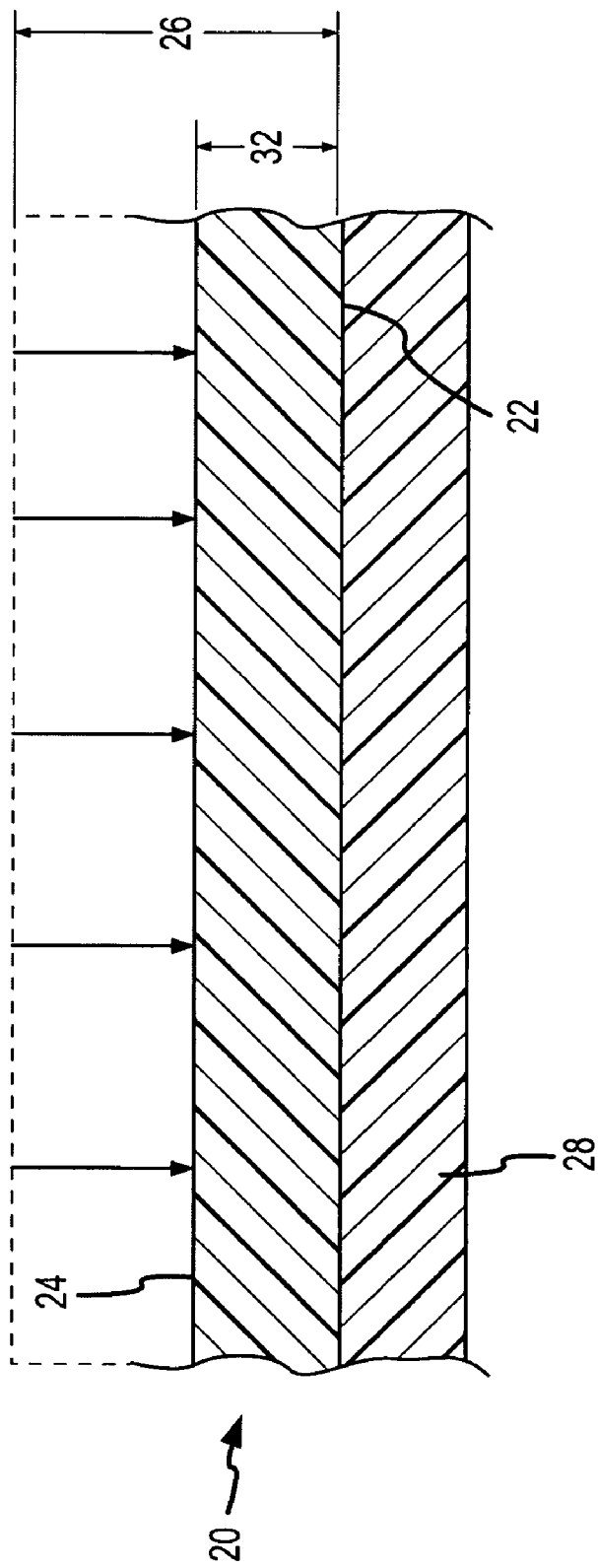
FIG. 3 is a cross-sectional side view of the semiconductor substrate of FIG. 2 after a thinning process.

As illustrated in FIG. 3, the semiconductor substrate 20 is then "thinned" from the back side 24 to reduce the thickness of the substrate 20 from the initial thickness 26 to a thinned thickness 32. The thinning process may be performed using a chemical mechanical polishing (CMP) process or wet chemical etch, and the thinned thickness 32 may be, for example, less than 200 microns, such as between 25 and 75 microns.

Figure 4:
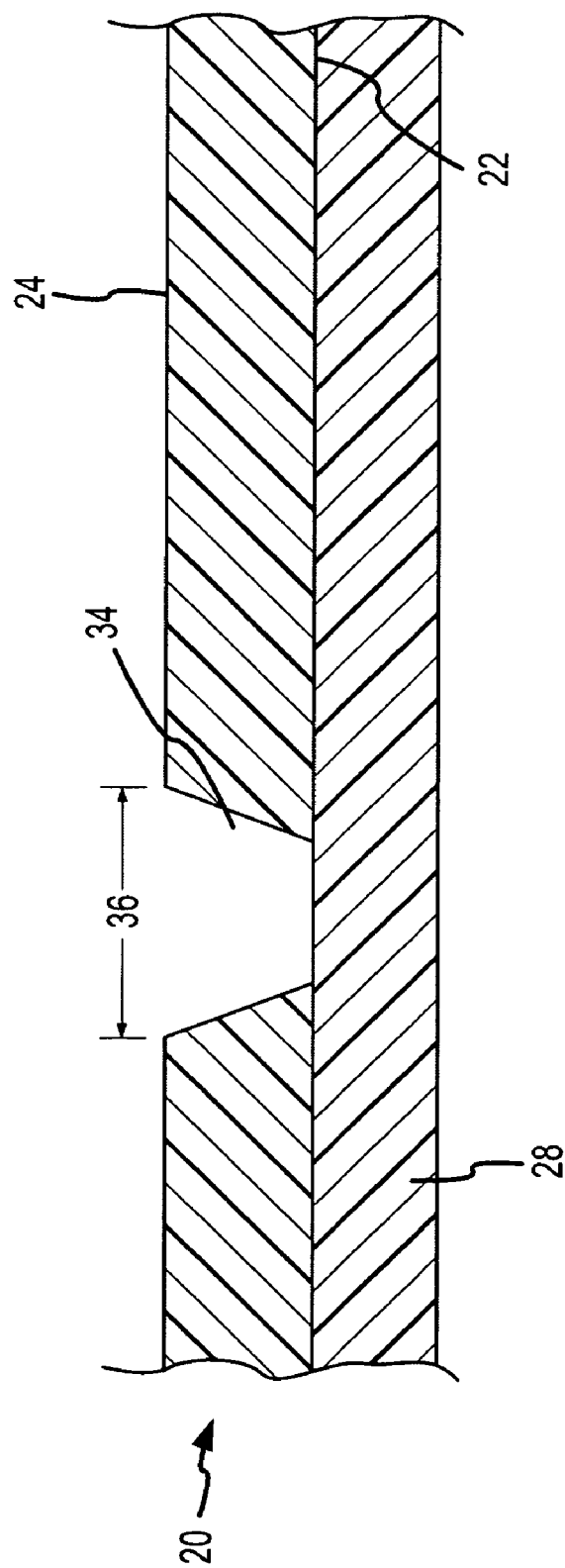
FIG. 4 is a cross-sectional side view of the semiconductor substrate of FIG. 3 after a via has been formed therethrough.

Referring to FIG. 4, the back side 24 of the semiconductor substrate 20 then undergoes a photoresist patterning and etching process to form vias 34 on the semiconductor substrate 20. The vias 34 may have a width 36 of, for example, between 35 and 65 microns and may penetrate the entire thickness of the substrate 20 to expose connections to the microelectronic devices formed on the front side 22 of the substrate 20.

Figure 5:
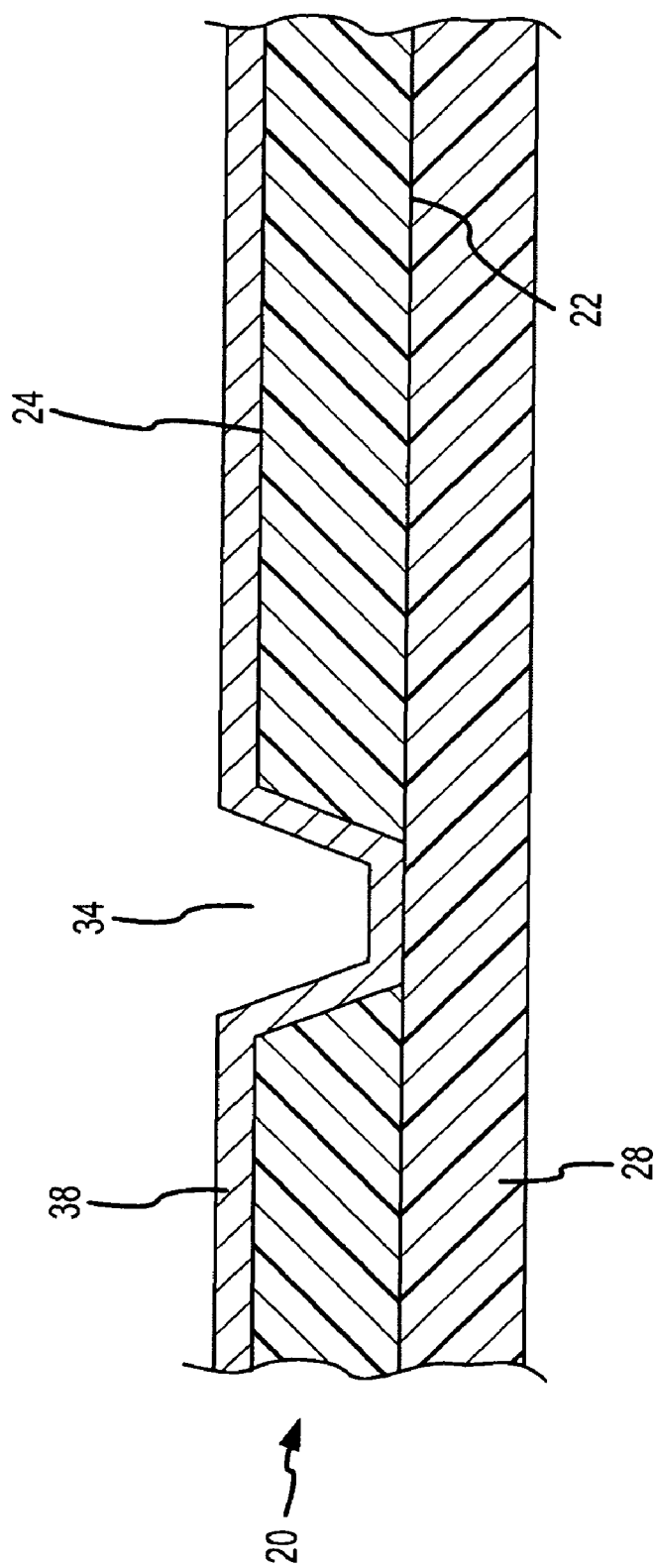
FIG. 5 is a cross-sectional side view of the semiconductor substrate of FIG. 4 with a conductive layer formed thereon.

As shown in FIG. 5, a conductive layer 38 is then formed on the back side 24 of the substrate 20. Although not illustrated in detail, the conductive layer 38 may include a titanium (Ti) layer sputtered to a thickness of approximately 2000 angstroms on the back side 24 of the substrate 20, a first gold layer sputtered on the titanium layer to a thickness of approximately 6000 angstroms, and a second gold layer plated on the first gold layer to a thickness of approximately 2.5 microns. The conductive layer 38 may completely cover the back side 24 of the substrate 20, including the vias 34. In subsequent processing steps, the conductive layer 38 may serve as the electrical bus layer used to deposit a bond pad and solder material. Although not specifically illustrated, it should be understood that the conductive layer 38 may contact the microelectronic devices formed on the front side 22 of the substrate 20.

Figure 6:
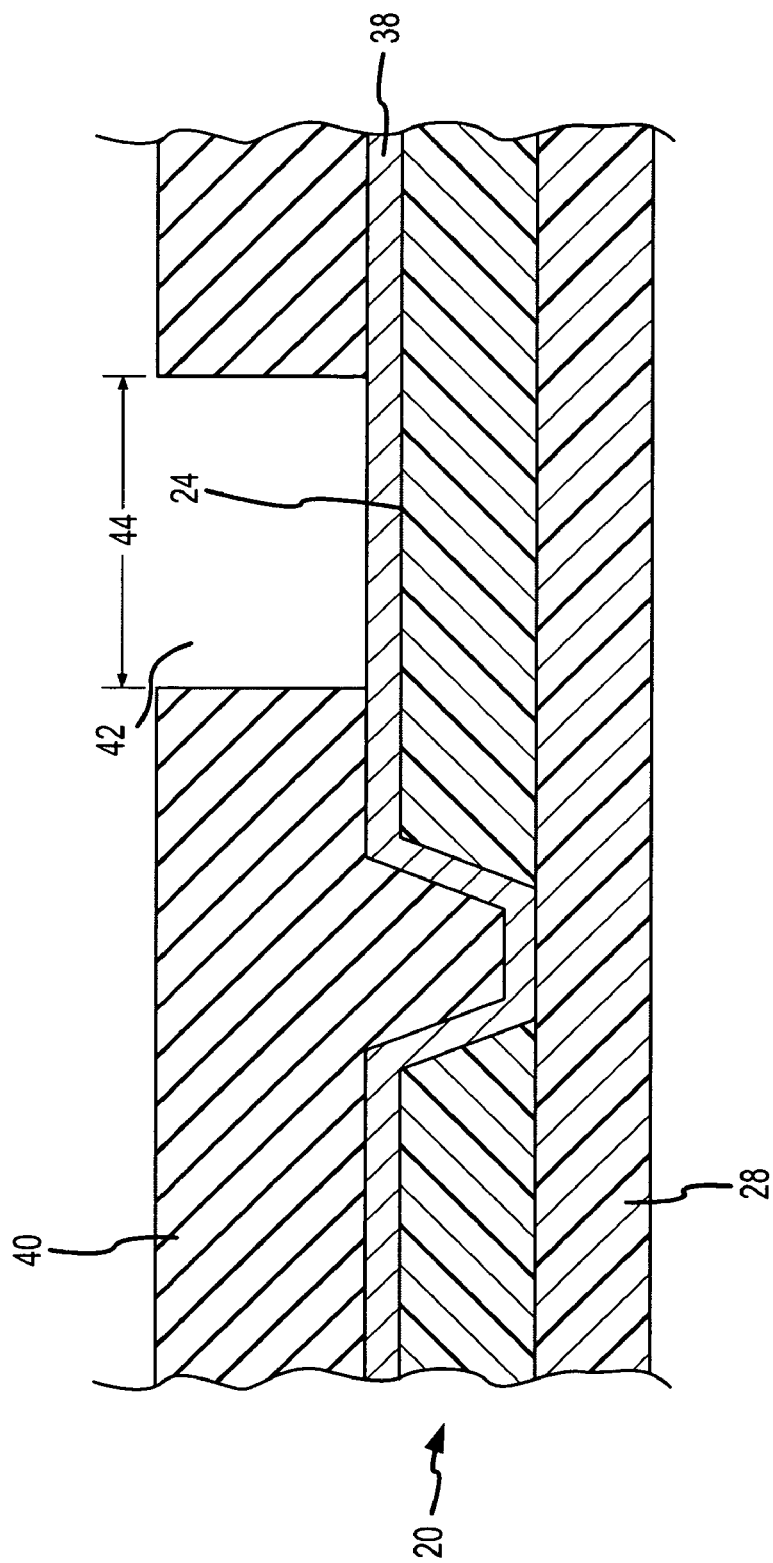
FIG. 6 is a cross-sectional side view of the semiconductor substrate of FIG. 5 with a photoresist layer formed over the conductive layer.

A photoresist layer 40 is then formed on the back side 24 of the substrate 20, as illustrated in FIG. 6. The photoresist layer 40 may have a thickness of, for example, between 7 and 75 microns. The photoresist layer 40 may be selectively exposed and developed to form a solder bump hole 42 therein over a portion of the conductive layer 38. The solder bump hole 42 may have a width 44 of, for example, between 50 and 100 microns.

Figure 7:
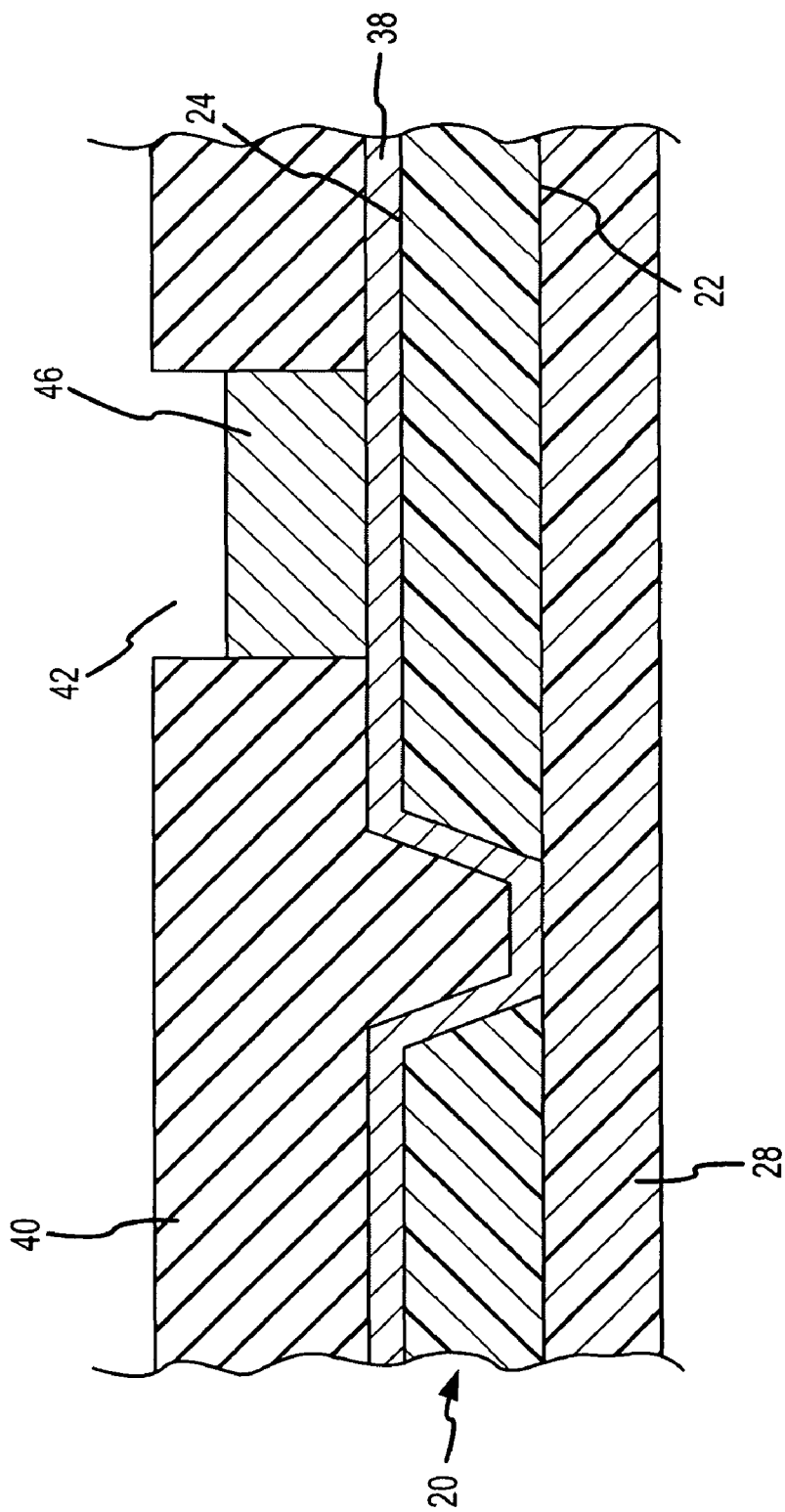
FIG. 7 is a cross-sectional side view of the semiconductor substrate of FIG. 6 with a solder bump barrier pad formed within the photoresist layer.
Figure 8:
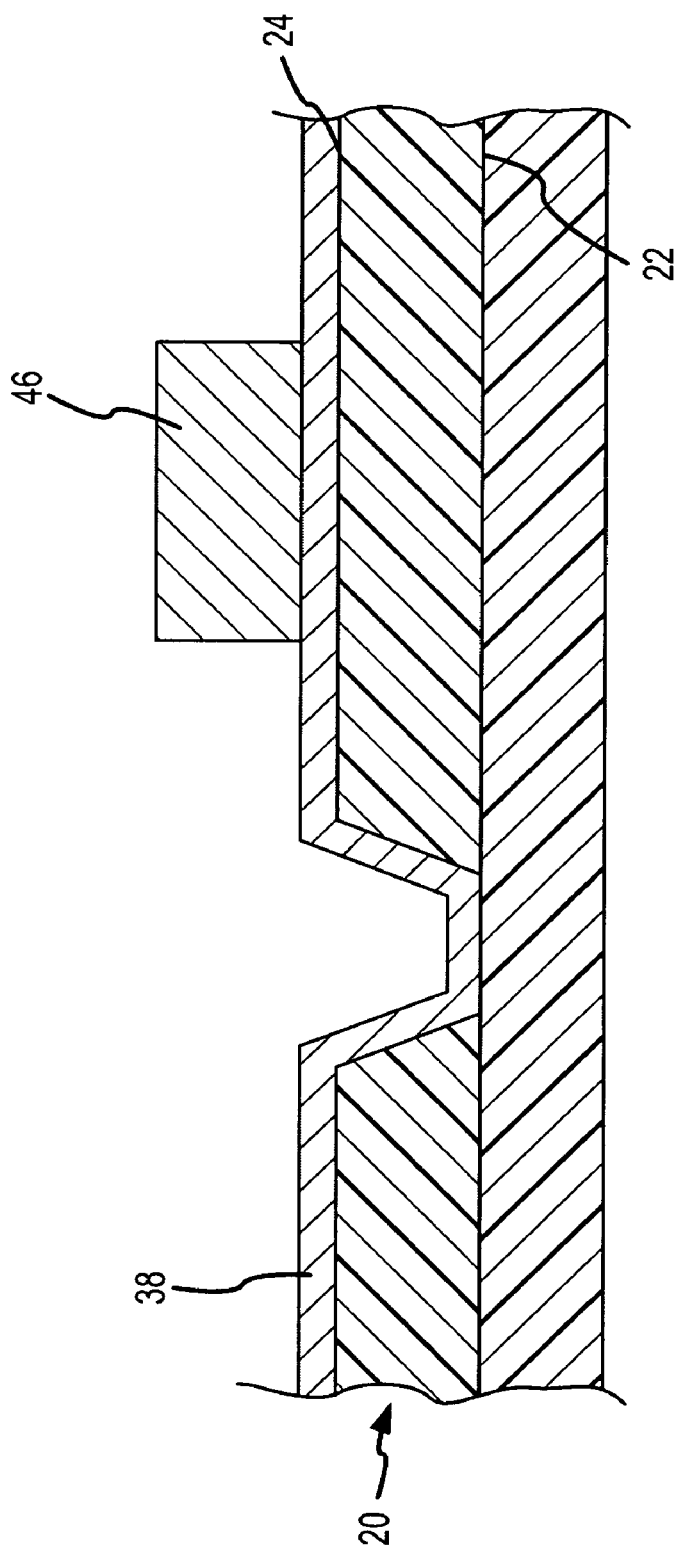
FIG. 8 is a cross-sectional side view of the semiconductor substrate of FIG. 7 after the photoresist layer has been removed.

Referring to FIG. 7, a solder bump barrier pad 46 (or solder interconnect pad or contact structure) is then formed in the solder bump hole 42 within the photoresist layer 40. The solder bump pad 46 may be formed on the exposed portion of the conductive layer 38 using sputtering, plating, or evaporation, and may be made of "solderable barrier metal" (i.e., forms a moderate amount intermetallics with solder), such as, nickel (Ni), copper (Cu), palladium (Pd), and/or chromium-copper (CrCu). After the formation of the solder bump barrier pad 46, the photoresist layer 40 is removed using, for example, a wet stripping process using various solvents known in the art, as shown in FIG. 8.

Figure 9:
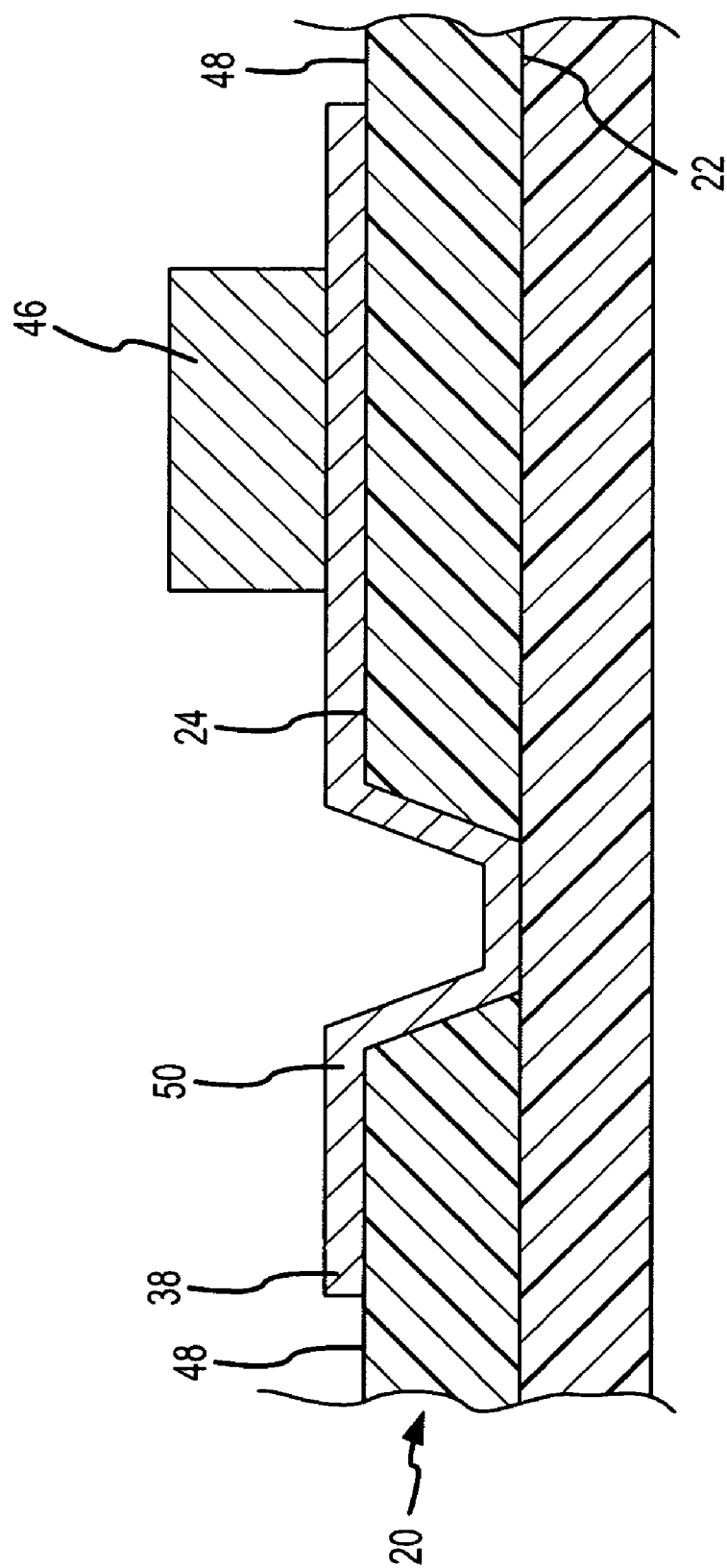
FIG. 9 is a cross-sectional side view of the semiconductor substrate of FIG. 8 after the conductive layer has been selectively etched.

Referring to FIG. 9, the conductive layer 38 may then be patterned with photoresist and selectively etched from particular regions on the back side 24 of the substrate 20 known as "streets" or street regions 48, as is commonly understood in the art, to form a plurality of conductors 50. Each conductor 50 may electrically connect one or more microelectronic device on the front side 22 of the substrate 20 to a solder bump pad 46 and be electrically disconnected from the other conductors.

Figure 10:
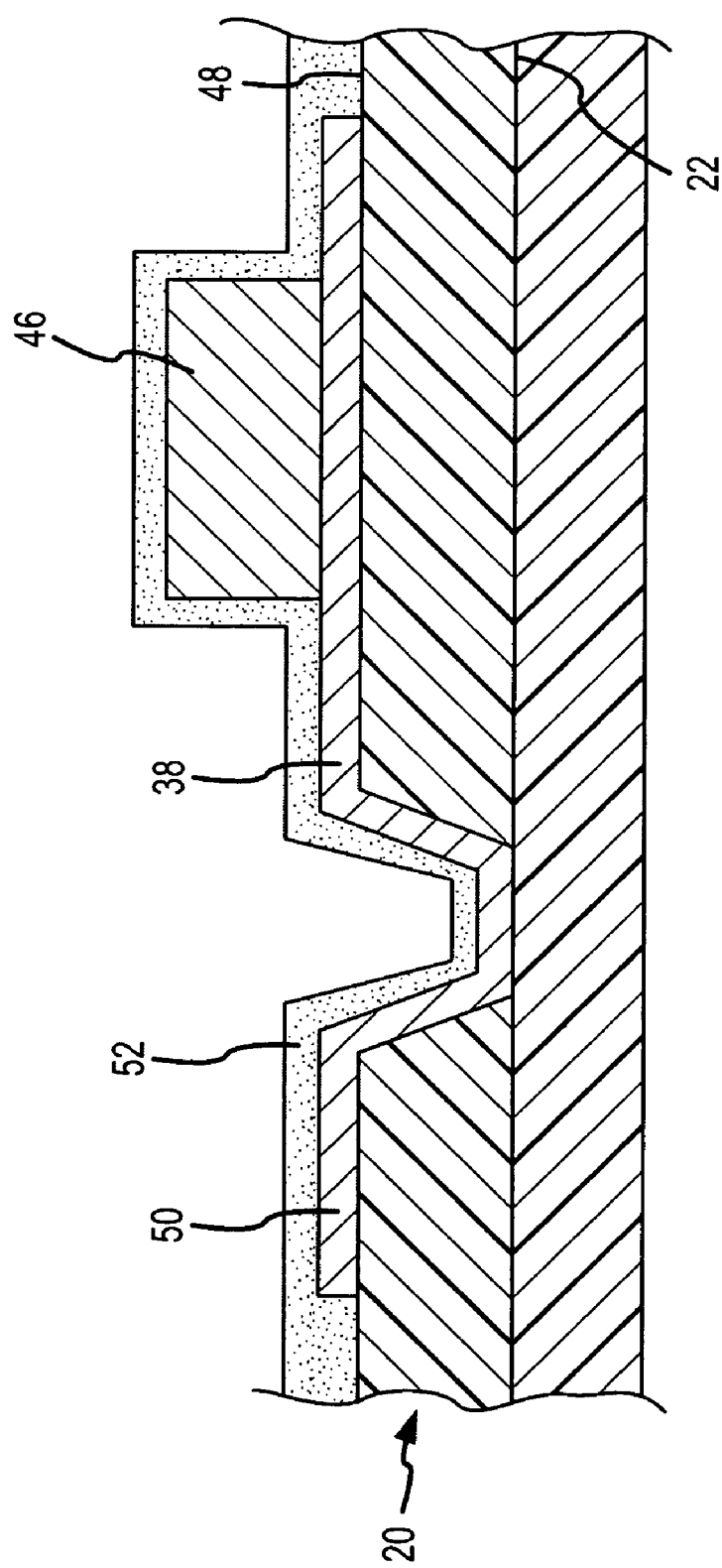
FIG. 10 is a cross-sectional side view of the semiconductor substrate of FIG. 9 with a passivation layer formed over the conductive layer and the solder bump pad.
Figure 11:
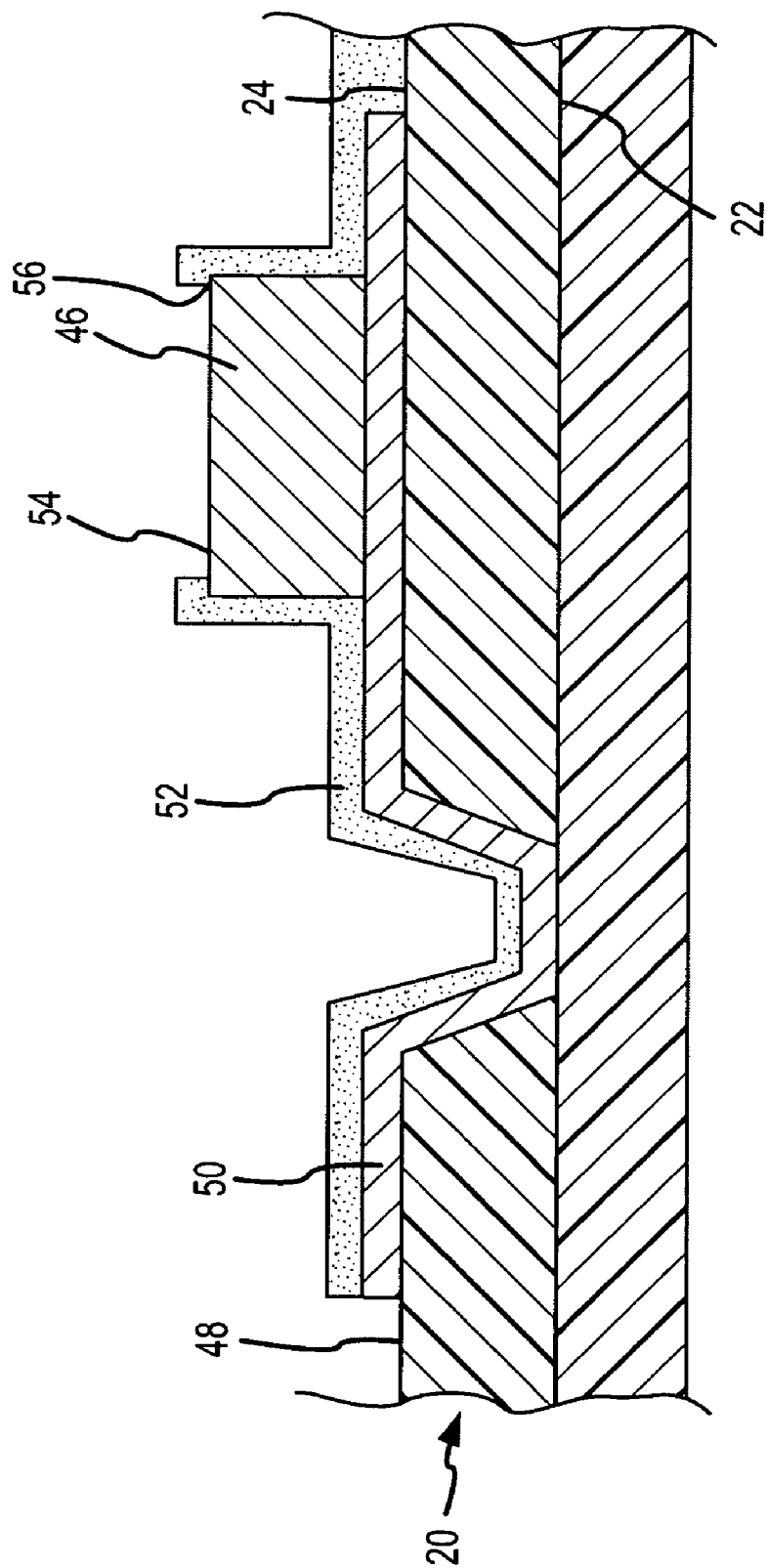
FIG. 11 is a cross-sectional side view of the semiconductor substrate of FIG. 10 after the passivation layer has been selectively etched.

A passivation layer 52 is then formed on the back side 24 of the substrate 20, as illustrated in FIG. 10. As shown, the passivation layer 52 completely covers the conductors 50 and, in one embodiment, the entire solder bump pad 46. The passivation layer 52 is made of a non-solderable material (i.e., does not easily form intermetallic bonds with solder), such as silicon nitride (SiN), may be formed using, for example, sputtering or chemical vapor deposition (CVD), and may have a thickness of between 1 and 2 microns. As shown in FIG. 11, the passivation layer 52 is then patterned with photoresist and selectively etched to remove a portion of the passivation layer 52 over the solder bump pad 46 and the street regions 48 between the die. As such, an exposed portion 54 of a top surface of the solder bump barrier pad 46 is formed, while the passivation layer 52 remains covered over the portion 56 on the side walls of the solder bump pad 46.

Figure 12:
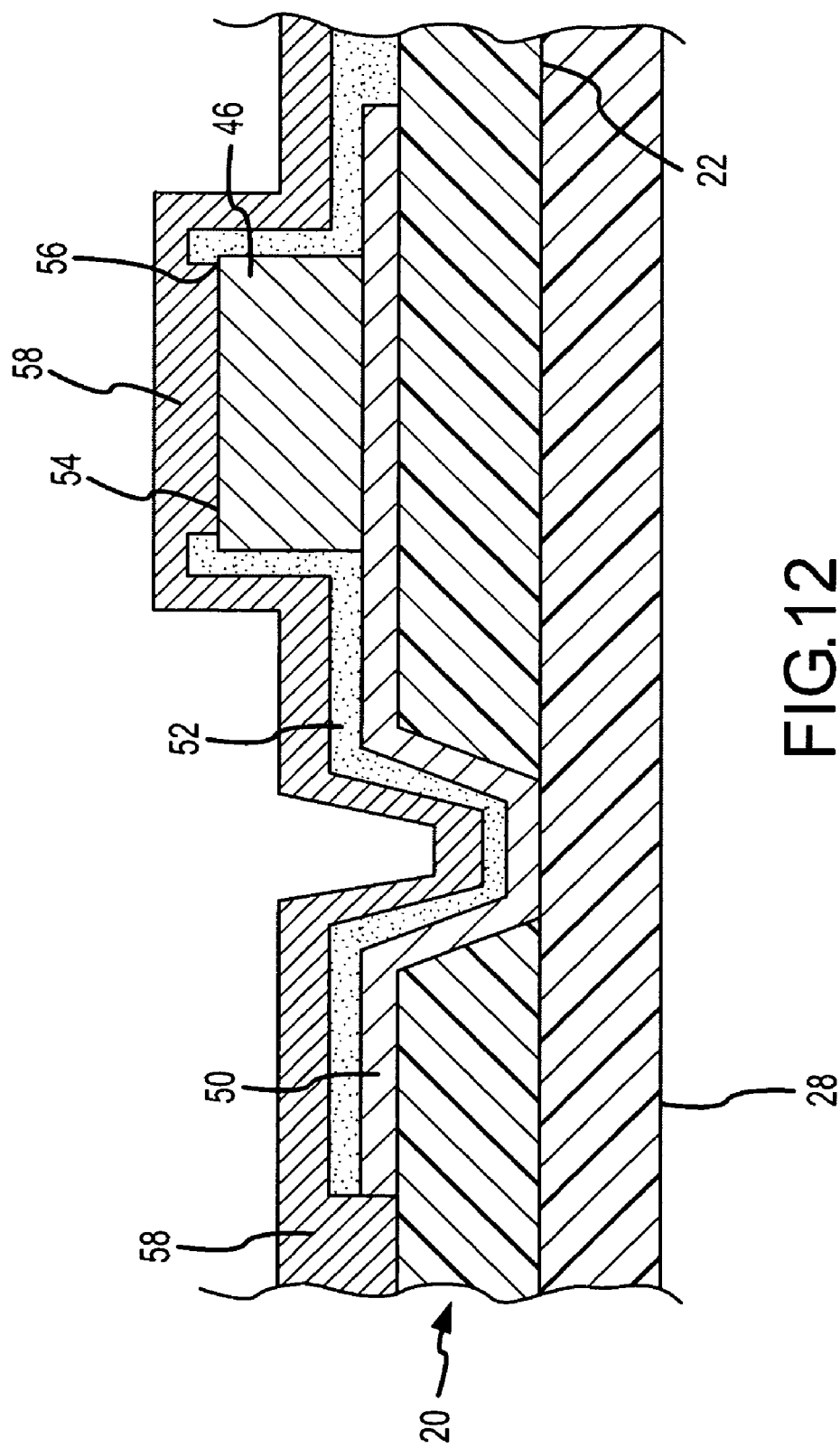
FIG. 12 is a cross-sectional side view of the semiconductor substrate of FIG. 11 with a solderable layer formed over the passivation layer and the solder bump pad.

Referring to FIG. 12, a protective "solderable" layer 58 is then formed over the passivation layer 52, including the exposed portion 54 of the top surface of the solder bump pad 46. The solderable layer 58 is made of a highly solderable material (i.e., a material that forms a high number of intermetallics with solder), as is commonly understood, such as gold (Au), tin (Sn), and palladium (Pd). The solderable layer 56 also serves to protect the underlying solder bump barrier pad 46 from oxidation prior to solder deposition. This can be done with the use of an in-situ pre-deposition sputter etch which removes oxidation from the solder bump barrier pad prior to the solderable metal deposition. The solderable layer 58 may be formed using sputtering, or evaporation, and have a thickness of, for example, between 300 and 1000 angstroms.

Figure 13:
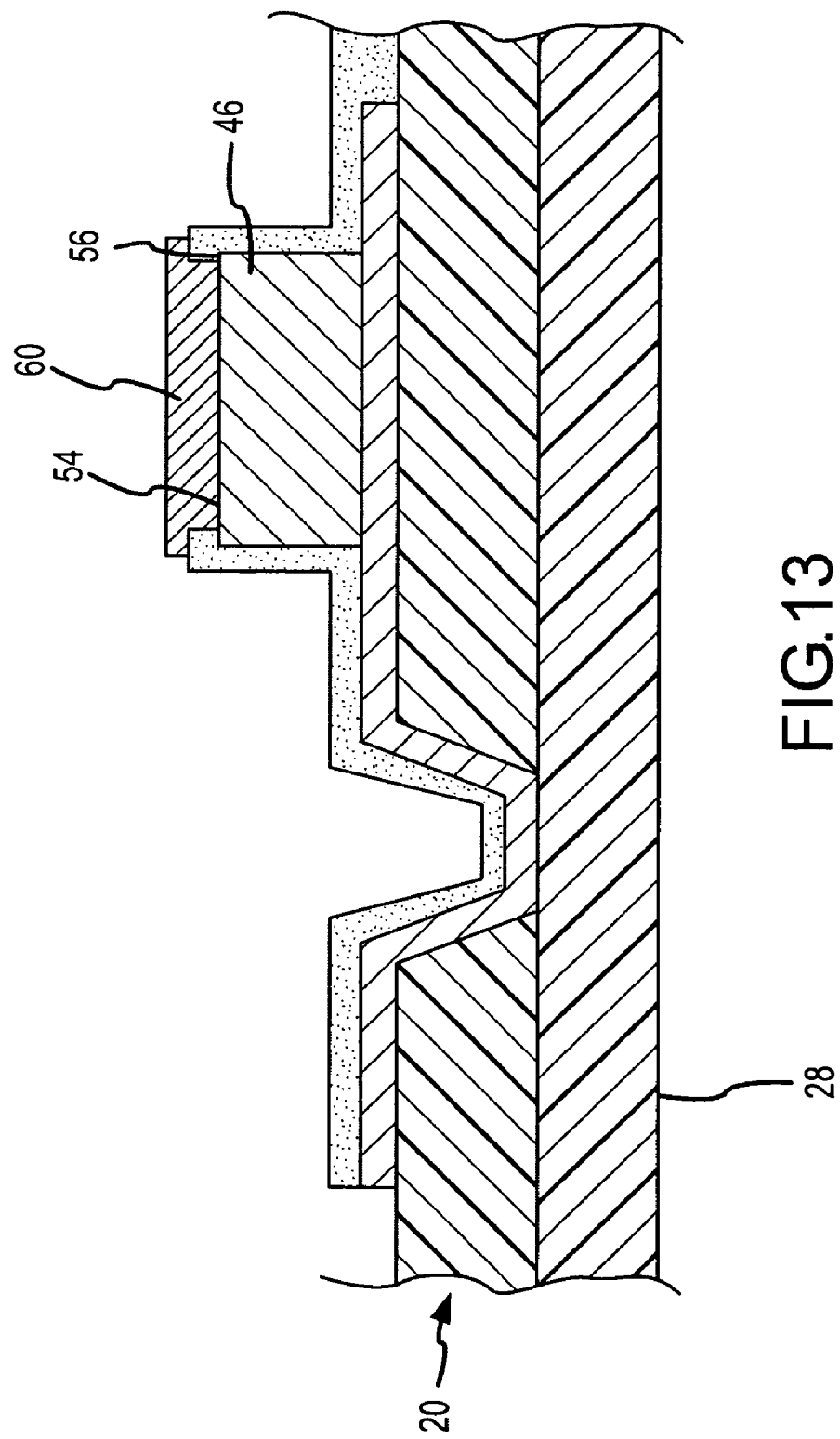
FIG. 13 is a cross-sectional side view of the semiconductor substrate of FIG. 12 after the solderable layer has been selectively etched.

The solderable layer 58 is then patterned with photoresist and selectively etched to remove all portions thereof except those covering the top surface of the solder bump pad 46, as shown in FIG. 13. The remaining portion of the solderable layer 58 forms a solderable body 60 over the exposed portion 54 of the top surface of the solder bump pad 46.

Figure 14:
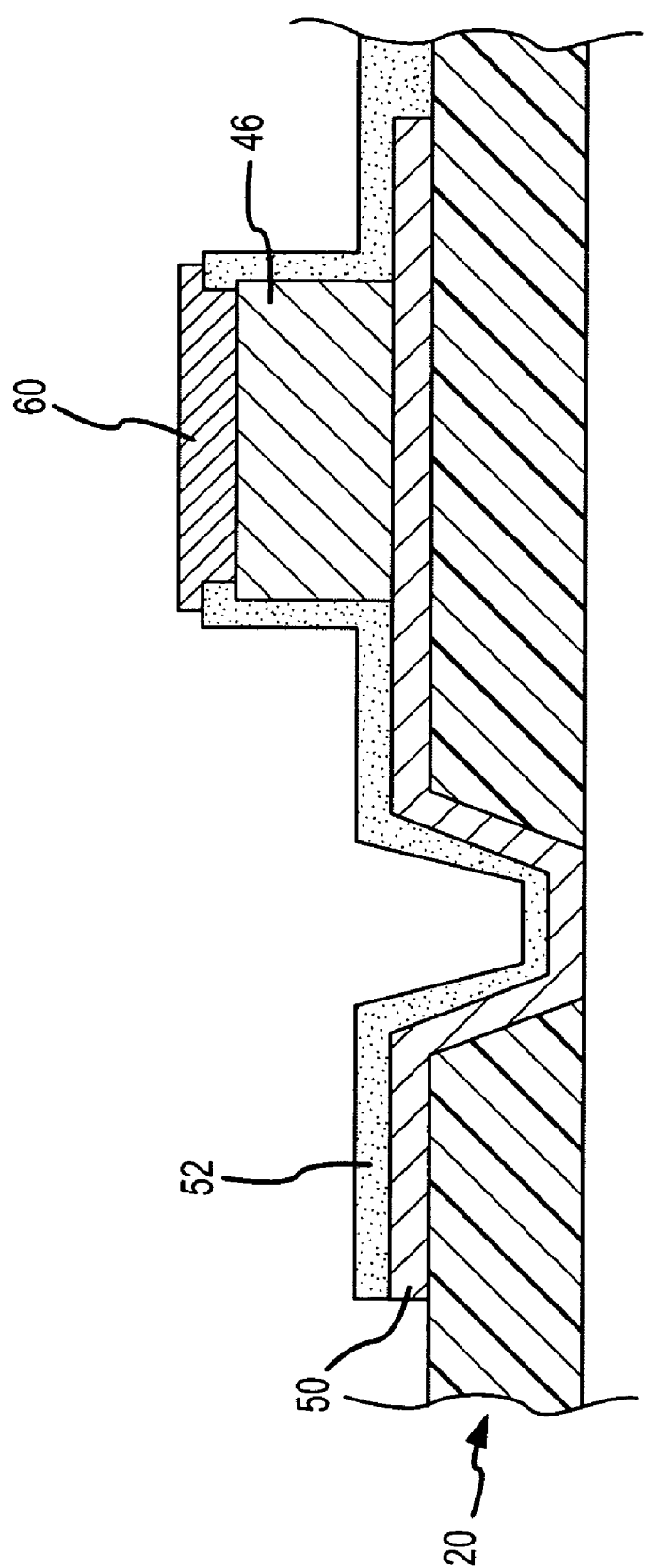
FIG. 14 is a cross-sectional side view of the semiconductor substrate of FIG. 13 illustrating the support substrate being demounted therefrom.

As shown in FIG. 14, the support substrate 28 may then be demounted from the semiconductor substrate 20. As will be appreciated by one skilled in the art, the low temperature, organic adhesive between the semiconductor substrate 20 and the support substrate 28 may be dissolved in specialized solvents held between, for example, 100 and 150° C.

Figure 15:
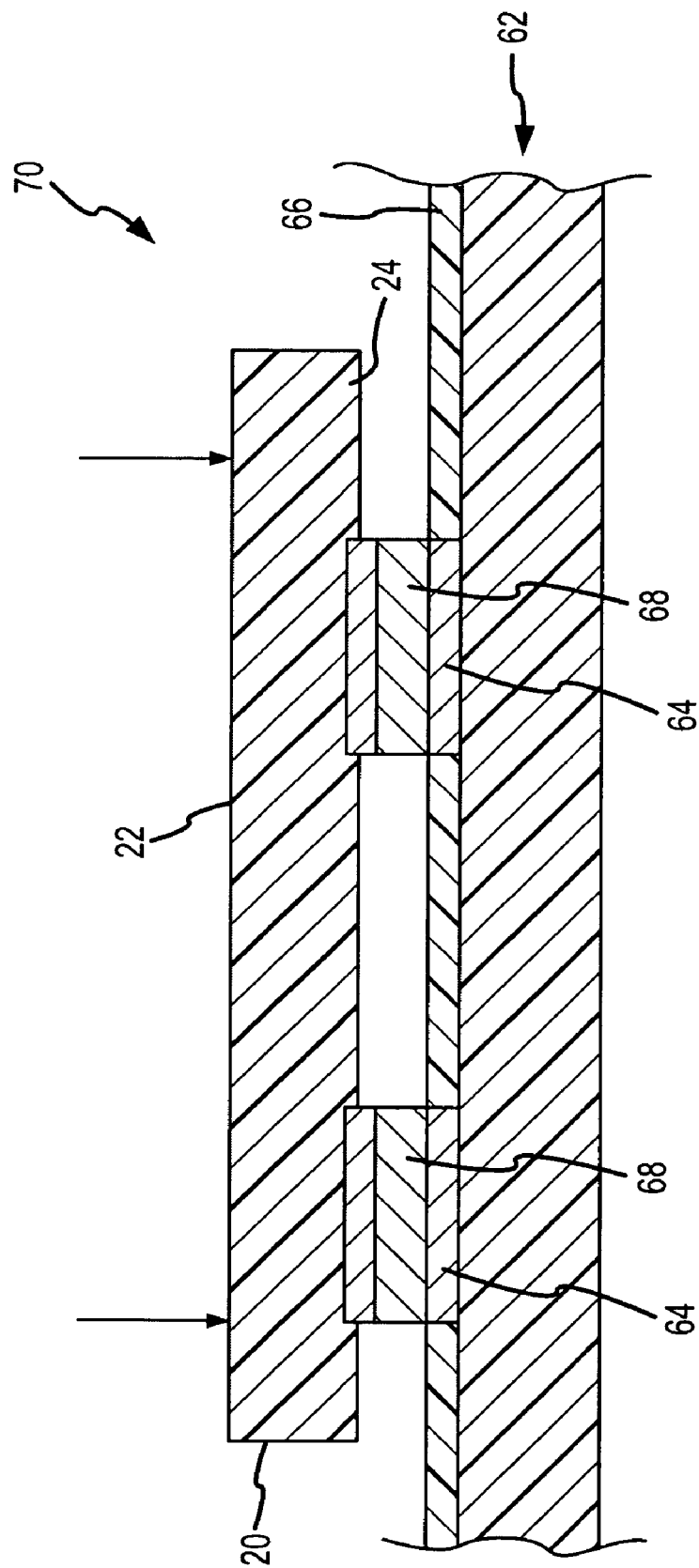
FIG. 15 is a cross-sectional side view of the semiconductor substrate of FIG. 14 connected to a package substrate thus forming a microelectronic assembly.

Although not illustrated, the semiconductor substrate 20 may then be singulated by normally accepted methods including but not limited to laser dicing or sawing into individual "dice," or semiconductor chips. Referring to FIG. 15, the substrate 20, or a single chip from the substrate 20, is then attached to a package substrate 62. The package substrate 62 includes a plurality of bonding pads 64 formed on an upper surface 66 thereof and a plurality of solder formations 68 (or bodies), each of which is deposited onto one of the bonding pads 64. The solder formations 68 may be screen printed onto the package substrate 62, heated to reflow, and stamped for uniformity. The solder formations 62 may be formed on the bonding pads 64 using electroplating or evaporation and may be made of, for example, lead-free solders, such as tin copper (SnCu), or lead-containing solders, such as high-Pb or eutectic lead tin (PbSn) alloys. Although not illustrated, the package substrate 62 may include a plurality of insulating layers and conductive traces therein, as is commonly understood in the art. The substrate 20 and the package substrate 62 may jointly form an electronic, or microelectronic, assembly 70.

Figure 16:
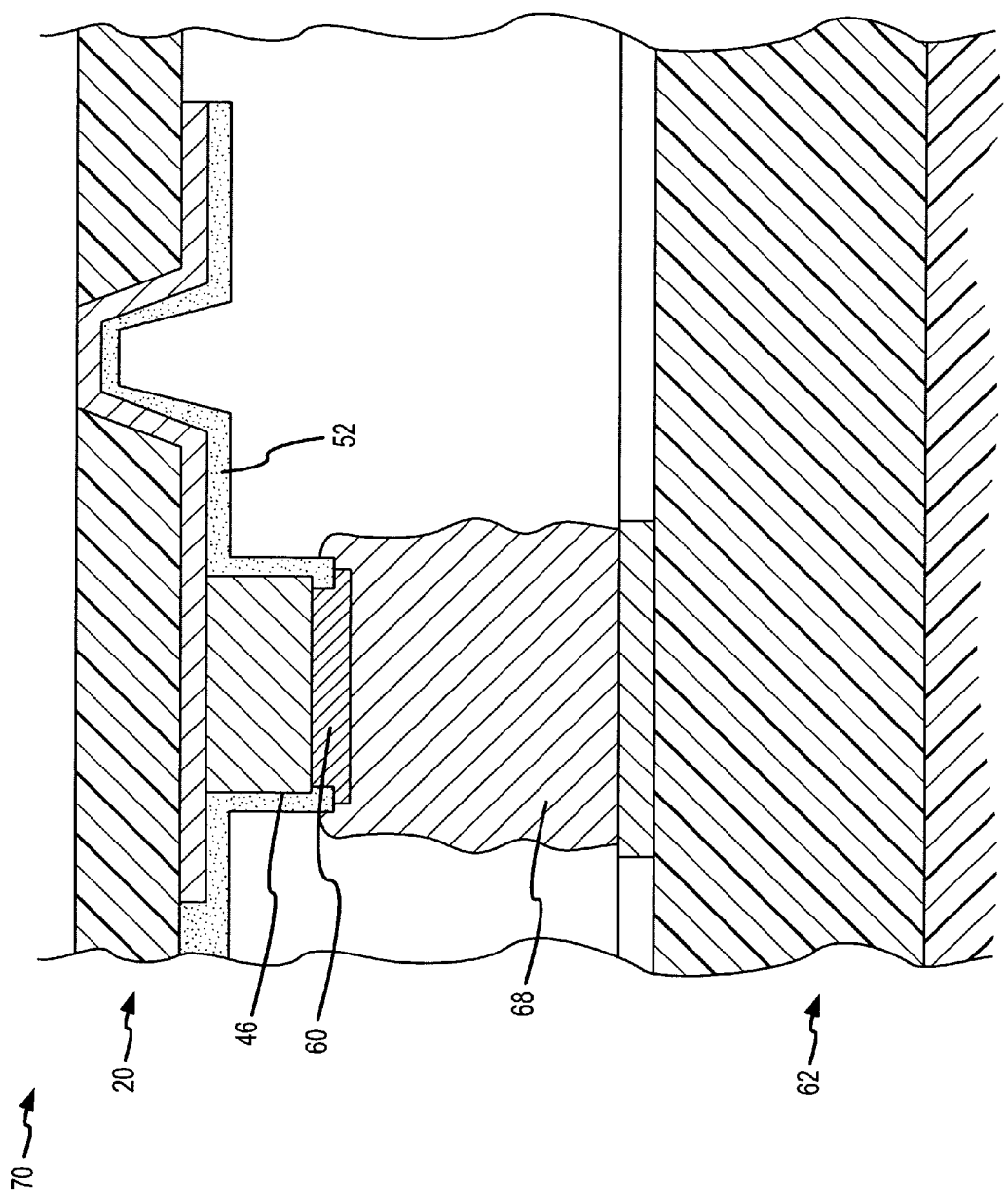
FIGS. 16 and 17 are cross-sectional side views of the microelectronic assembly of FIG. 15 illustrating a solder formation undergoing a reflow process.
Figure 17:
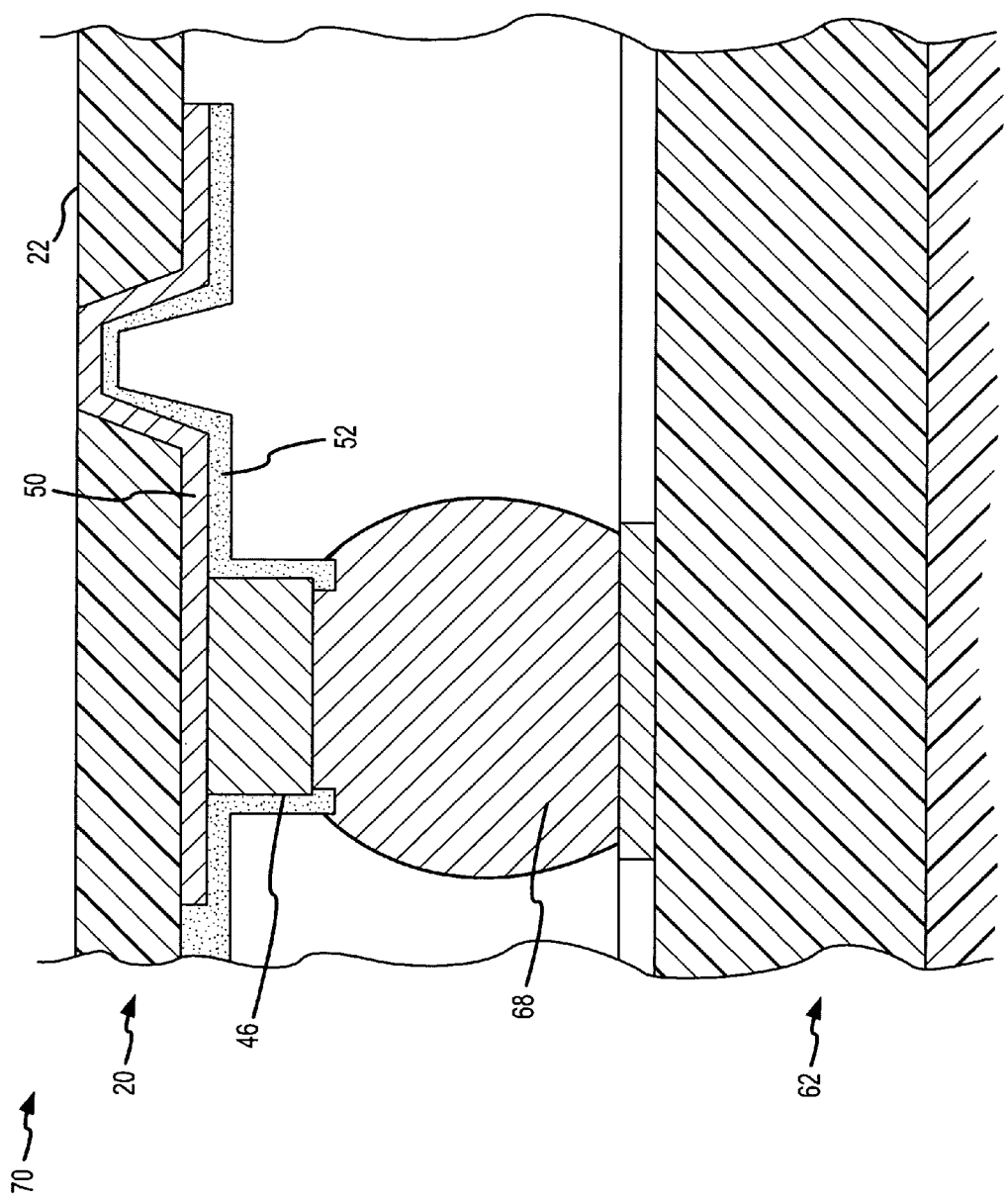

FIGS. 16 and 17 illustrate a portion of the microelectronic assembly 70 as the assembly 70 undergoes a heating process to re-flow the solder formations 68. As shown specifically in FIG. 16, before the reflow, the solderable body 60 separates the solder bump pad 46 from the solder formation 68. However, as shown in FIG. 17, during the heating process, which may be performed in an "oven," the solderable body 60 readily forms intermetallic compounds with the solder formation 68 such that the solderable body 60 essentially becomes part of the solder bump 68, and thus disappears. The solder formation 68 then forms a moderate amount of intermetallic bonds with the solder bump pad 46 such that the substrate 20 is "bonded" to the package substrate 62 and the microelectronic devices on the top side 22 of the substrate 20 are electrically connected to the package substrate 62 through the solder bump pad 46 and the solder formation 68.

Of particular interest in FIG. 17 is the separation between the conductor 50 and the solder formation 68 provided by the solder bump barrier pad 46 and the passivation layer 52. Because the sides of the solder bump pad 46, as well as otherwise exposed portions of the conductor 50, are covered by the passivation layer 52 and the moderate solderability of the solder bump pad 46, the likelihood that any portion of the conductor 50 will make contact with, and thus be damaged by, any hot solder material is greatly reduced.

The invention provides a method for forming a microelectronic assembly. A contact structure is formed over a first side of a first substrate having a microelectronic device formed over a second side thereof. The contact structure is electrically connected to the microelectronic device. A non-solderable layer is formed over at least a portion of the contact structure and at least a portion of the first substrate. The contact structure and a second substrate are interconnected with solder.

The contact structure may include a solderable barrier metal. The non-solderable layer may be formed over the entire contact structure.

The method may also include removing a portion of the non-solderable layer to expose a portion of the contact structure. The solder may contact the exposed portion of the contact structure. The method may also include forming a conductor on the first substrate. The conductor may interconnect the contact structure and the microelectronic device and comprising a solderable material. The non-solderable layer may be formed over the conductor.

The method may also include forming a solderable layer on the exposed portion of the contact structure. The non-solderable layer may be a passivation layer and include silicon nitride. The contact structure may include at least one of nickel, chromium-copper, copper, and palladium. The conductor and the solderable layer may each include at least one of gold, tin, and copper and the solder comprises a lead-free, tin based solder material.

The first substrate may be a semiconductor substrate and include gallium arsenide. The microelectronic device may be formed on a first side of the first substrate, and the conductor may be formed on a second side of the first substrate. The method may also include mounting the first substrate to a support substrate and thinning the support substrate from the back side.

The invention also provides a method for forming a microelectronic assembly. A conductor is formed over a semiconductor substrate having an integrated circuit formed over a front side thereof. The conductor is electrically connected to the integrated circuit and includes a first solderable material. A contact structure is formed over a back side of the semiconductor substrate. The contact structure is electrically connected to the conductor and includes a solderable barrier metal. A passivation layer is formed over the contact structure and at least a portion of the conductor. A portion of the passivation layer is removed to expose a portion of the contact structure. A solderable layer is formed over the exposed portion of the contact structure. The solderable layer includes a second solderable material. The semiconductor substrate is attached to a package substrate using solder. The solder interconnects the contact structure and the package substrate.

The first and second solderable materials may each include at least one of gold, tin, and copper. The contact structure may include at least one of nickel, chromium-copper, copper, and palladium. The conductor may be formed over the back side of the semiconductor substrate.

The attachment of the semiconductor substrate to the package substrate may include heating the solder to cause intermetallic compound formation between the solder and the solderable layer. The semiconductor substrate may include gallium arsenide and have a first thickness.

The method may also include mounting the semiconductor substrate to a support substrate having a first thickness. The support substrate may be adjacent to the front side of the semiconductor substrate and include at least one of sapphire and quartz. The semiconductor substrate may be thinned from the first thickness to a second thickness. The second thickness may be less than 200 microns. The semiconductor substrate may be demounted from the support substrate.

The invention further provides a microelectronic assembly including a first substrate having a microelectronic device formed over a front side thereof, a conductor formed over a back side of the first substrate, the conductor being electrically connected to the microelectronic device, a contact structure formed over the conductor, the contact structure having a plurality of lateral sides and a top side and being electrically connected to the conductor, the top side of the contact structure having first and second portions, a non-solderable layer formed over the conductor, the lateral sides of the contact structure, and the first portion of the contact structure, a solder formation bonded to the second portion of the top side of the contact structure, and a second substrate bonded to the solder formation.

The conductor may include at least one of gold, tin, and copper. The contact structure may include at least one of nickel, chromium-copper, copper, and palladium. The first substrate may be a semiconductor substrate. The microelectronic device may comprise at least one transistor. The non-solderable layer may include silicon nitride. The semiconductor substrate may include gallium arsenide. The second substrate may be a package substrate.

It should be understood that, as used herein, the term coupled is defined as and may be used interchangeably with connected, although not necessarily directly, and not necessarily mechanically. Additionally, the terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a microelectronic assembly comprising:
   forming a conductor on a first side of a first substrate having a microelectronic device formed over a second side thereof, the conductor being electrically connected to the microelectronic device and comprising a solderable material;
   forming a contact structure over the first side of the first substrate, the contact structure being electrically connected to the conductor and comprising a solderable barrier metal, wherein the barrier metal comprises at least one of nickel, chromium-copper, and palladium;
   forming a non-solderable layer over the contact structure and at least a portion of the first substrate and the conductor, wherein the non-solderable layer is a passivation layer and comprises silicon nitride;
   removing a portion of the non-solderable layer to expose a portion of the contact structure;
   forming a solderable layer on the exposed portion of the contact structure; and
   interconnecting the contact structure and a second substrate with solder, wherein the solder contacts the exposed portion of the contact structure.

2. The method of claim 1, wherein the conductor and the solderable layer each comprise at least one of gold, tin, and copper and the solder comprises a lead-free, tin based solder material.

3. The method of claim 1, wherein the first substrate is a semiconductor substrate and comprises gallium arsenide, and wherein the solderable barrier metal is selected from the group consisting of nickel, chromium-copper, copper, and palladium.

4. The method of claim 1, further comprising:
   mounting the first substrate to a support substrate with an adhesive having a softening temperature of less than 160° C. before the forming of the conductor;
   thinning the first substrate from the first side thereof; and
   demounting the first substrate from the support substrate after the forming of the contact structure.

5. A method for forming a microelectronic assembly comprising:
   forming a conductor over a semiconductor substrate having an integrated circuit formed over a front side thereof, the conductor being electrically connected to the integrated circuit and comprising a first solderable material;
   forming a contact structure over a back side of the semiconductor substrate, the contact structure being electrically connected to the conductor and consisting of a solderable barrier metal;
   forming a passivation layer over the contact structure and at least a portion of the conductor;
   removing a portion of the passivation layer to expose a portion of the contact structure;
   forming a solderable layer over the exposed portion of the contact structure, the solderable layer comprising a second solderable material; and
   attaching the semiconductor substrate to a package substrate using solder, the solder interconnecting the contact structure and the package substrate,
   wherein the first and second solderable materials each comprise at least one of gold, tin, and copper, and the solderable barrier metal is selected from the group consisting of nickel, chromium-copper, copper, and palladium.

6. The method of claim 5, wherein the conductor is formed over the back side of the semiconductor substrate.

7. The method of claim 6, wherein the attaching of the semiconductor substrate to the package substrate comprises heating the solder, said heating causing intermetallic compound formation between the solder and the solderable layer.

8. The method of claim 7, wherein the semiconductor substrate comprises gallium arsenide has a first thickness and further comprising:
   mounting the semiconductor substrate to a support substrate having a first thickness with an adhesive having a softening temperature of below 160° C., the support substrate being adjacent to the front side of the semiconductor substrate and comprising at least one of sapphire and quartz;
   thinning the semiconductor substrate from the first thickness to a second thickness, the second thickness being less than 200 microns; and
   demounting the semiconductor substrate from the support substrate after the forming of the solderable layer and before the attaching of the semiconductor substrate to the package substrate.

9. A microelectronic assembly comprising:
   a first substrate having a microelectronic device formed over a front side thereof;
   a conductor formed over a back side of the first substrate, the conductor being electrically connected to the microelectronic device;
   a contact structure formed over the conductor, the contact structure having a plurality of lateral sides and a top side and being electrically connected to the conductor, the top side of the contact structure having first and second portions, the contact formation consisting of a solderable barrier metal;
   a non-solderable layer formed over the conductor, the lateral sides of the contact structure, and the first portion of the contact structure;
   a solder formation bonded to the second portion of the top side of the contact structure; and
   a second substrate bonded to the solder formation,
   wherein the conductor comprises at least one of gold, tin, and copper and the solderable barrier metal is selected from the group consisting of nickel, chromium-copper, copper, and palladium.

10. The microelectronic assembly of claim 9, wherein the first substrate is a semiconductor substrate and the microelectronic device comprises at least one transistor.

11. The microelectronic assembly of claim 10, wherein the non-solderable layer comprises silicon nitride.

12. The microelectronic assembly of claim 11, wherein the semiconductor substrate comprises gallium arsenide and the second substrate is a package substrate.

* * * * *